United States Patent [19]

Ohuchi

[11] Patent Number: 4,766,382

[45] Date of Patent: Aug. 23, 1988

[54] TWO-DIMENSIONAL NUCLEAR MAGNETIC RESONANCE SPECTROMETRY

[75] Inventor: Muneki Ohuchi, Tokyo, Japan

[73] Assignee: Jeol Ltd., Tokyo, Japan

[21] Appl. No.: 18,492

[22] Filed: Feb. 25, 1987

Related U.S. Application Data

[63] Continuation-in-part of Ser. No. 732,846, May 10, 1985, Pat. No. 4,677,383.

[51] Int. Cl.$^4$ .............................................. G01R 33/20
[52] U.S. Cl. .................................... 324/312; 324/309; 324/311
[58] Field of Search ............... 324/307, 309, 311, 312, 324/314; 364/413, 414, 726

[56] References Cited

U.S. PATENT DOCUMENTS

| | | | |
|---|---|---|---|
| 4,045,723 | 8/1977 | Ernst | 324/309 |
| 4,068,161 | 1/1978 | Ernst | 324/309 |
| 4,238,735 | 12/1980 | Muller | 324/310 |
| 4,510,449 | 4/1985 | Ernst et al. | 324/309 |
| 4,513,247 | 4/1985 | Ernst | 324/309 |
| 4,611,172 | 9/1986 | Takase | 324/309 |

OTHER PUBLICATIONS

Kauppinen, J. K. et al., "Noise in Fourier Self-Deconvolution", Applied Optics, vol. 20, No. 10, May 15, 1981.

Kauppinen, J. K. et al., "Fourier Transforms . . . Overlapped Band Contours", Analytical Chemistry, vol. 53, No. 9, Aug. 1981.

Aue, W. P. et al., "Two-Dimensional Spectroscopy, Application to Nuclear Magnetic Resonance", J. of Chemical Physics, vol. 64, No. 5, 1 Mar. 1976, pp. 2229–2246.

*Primary Examiner*—Stewart J. Levy
*Assistant Examiner*—Kevin D. O'Shea
*Attorney, Agent, or Firm*—Webb, Burden, Ziesenheim & Webb

[57] ABSTRACT

A two-dimensional nuclear magnetic resonance spectrometry which comprises the following steps to facilitate phase correction:

(a) taking the Fourier transform of the set $S(t_1, t_2)$ of the free induction decay signals with respect to $t_2$ to generate the transformed data sets of $S_c(t_1, F_1)$ or $S_s(t_1, F_2)$, the signals being stored in the memory corresponding to the values of $t_1$;

(b) obtaining data $S_c(t_{1000}, F_2)$ and $S_s(t_{1000}, F_2)$ whose phases have been shifted by phase angle $\theta_2$, from the initial data $S_c(t_{1000}, F_2)$ and $S_s(t_{1000}, F_2)$ contained in two Fourier components $S_c(t_1, F_2)$ and $S_s(t_1, F_2)$ derived by the Fourier transformation made in the step (a), in such a way that the peak contained in the initial data $S_c(t_{1000}, F_2)$ and $S_s(t_{1000}, F_2)$ takes an absorption or dispersion waveform to make phase correction;

(c) shifting the phases of the data in the data sets $S_c(t_1, F_2)$ or $S_s(t_1, F_2)$ derived in the step (b) by phase angle $\theta_1$ to make phase correction with respect to $t_1$; and (d) taking the Fourier transform of the data sets $S_c(t_1, F_2)$ or $S_s(t_1, F_2)$ with respect to $t_1$.

1 Claim, 4 Drawing Sheets

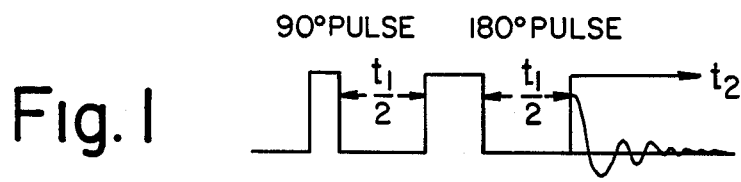
Fig. 1
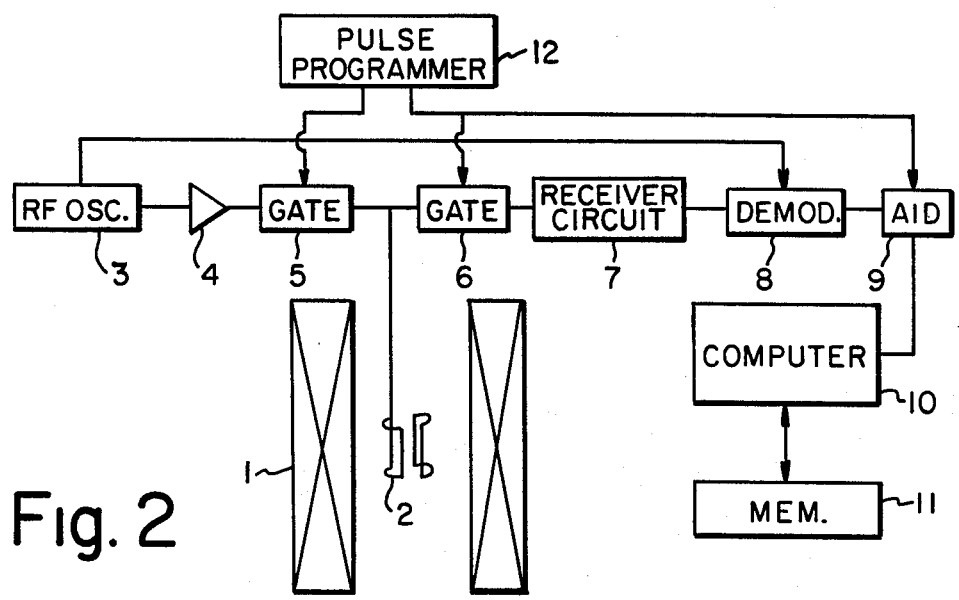
Fig. 2
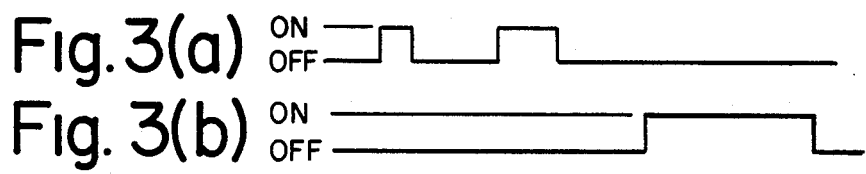
Fig. 3(a)
Fig. 3(b)
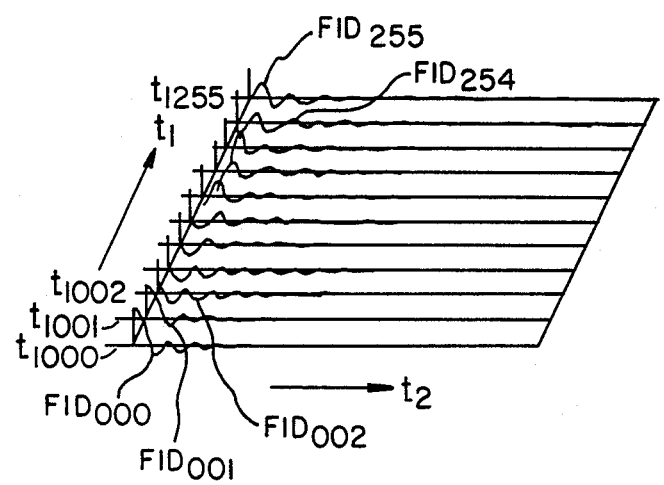
Fig. 4

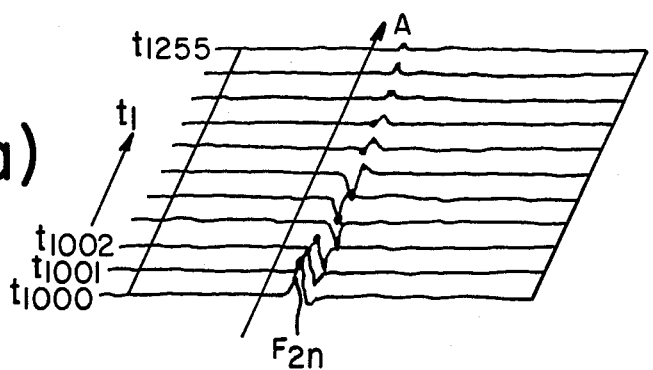
Fig. 5(a)
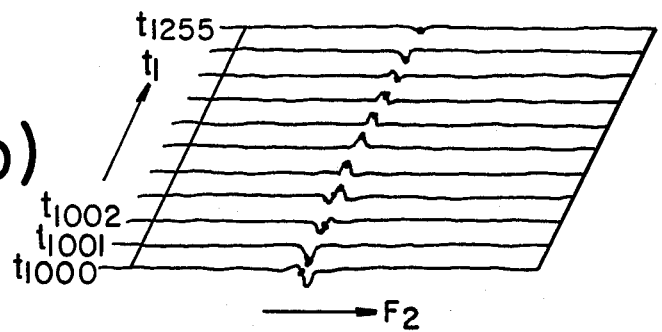
Fig. 5(b)
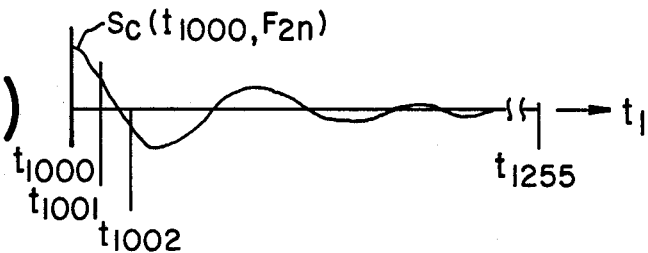
Fig. 6(a)
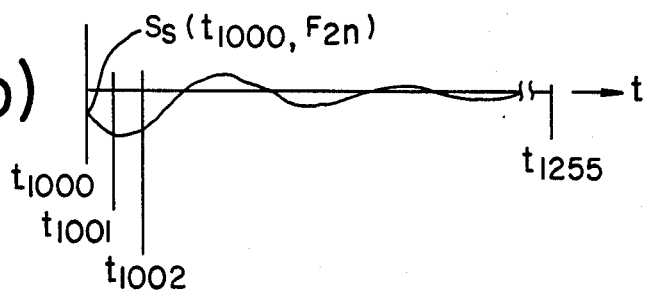
Fig. 6(b)
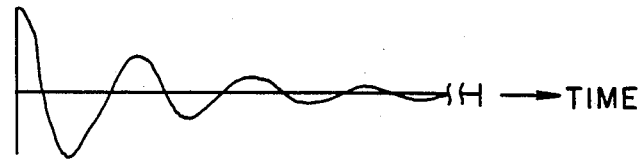
Fig. 6(a')
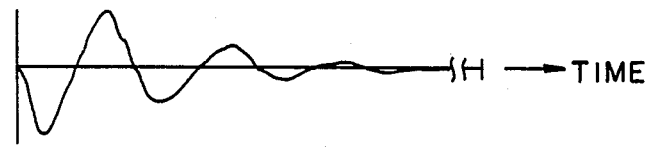
Fig. 6(b')

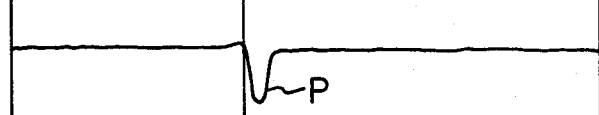
Fig. 7(a)
Fig. 7(b)
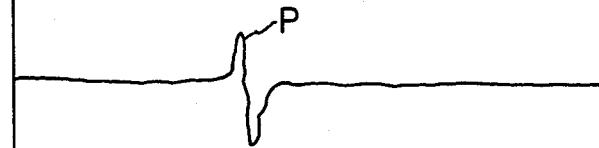
Fig. 7(a')
Fig. 7(b')
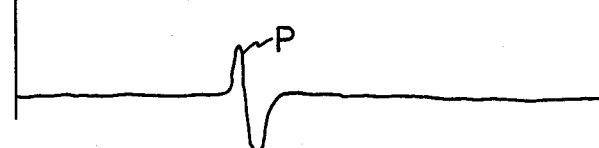
Fig. 7(a")
Fig. 7(b")

TWO-DIMENSIONAL NUCLEAR MAGNETIC RESONANCE SPECTROMETRY

RELATED APPLICATION

This application is a continuation-in-part of U.S. application Ser. No. 732,846, filed May 10, 1985, now U.S. Pat. No. 4,677,383.

BACKGROUND OF THE INVENTION

The present invention relates to a two-dimensional nuclear magnetic resonance spectrometry and, more particularly, to a two-dimensional nuclear magnetic resonance spectrometry that can offer two-dimensional spectra whose phases have been corrected.

In recent years, two-dimensional nuclear magnetic resonance spectrometry has attracted special interest as a new NMR spectrometry. According to this spectrometry (the spectrometry specified by W. P. Aue, E. Bartholdi, and R. R. Ernst in "Two-dimensional spectroscopy. Application to nuclear magnetic resonance," *Journal of Chemical Physics*, Vol. 64, No. 5, Mar. 1, 1976, pp. 2229-2246), NMR signals are represented as a two-dimensional spectrum, and therefore it yields higher resolution than the prior art method, i.e., a resonance line is better split into multiplet lines. This facilitates analyzing spectra and so the spectrometry is expected to find much wider application in the future.

FIG. 1 shows a sequence of measurements made for J-resolved two-dimensional NMR which is one of the two-dimensional NMRs. Specifically, a 90° pulse and a 180° pulse are applied at a time interval of $t_1/2$ to a sample containing gyromagnetic resonators. After the lapse of $t_1/2$, the resulting free induction decay signal is detected for a period $t_2$ and stored in a memory. This one measurement is repeated many times with incrementally different values of $t_1$. The free induction decay signals which are obtained by these measurements are stored in the memory, corresponding to the values of $t_1$. Then, the set $S(t_1, t_2)$ of the signals are subjected to double Fourier transformation with respect to $t_2$ and $t_1$ to derive a two-dimensional spectrum.

In this two-dimensional NMR spectrometry, it is difficult to correct the phase of the obtained two-dimensional spectrum. Therefore, the spectrum is derived as a power spectrum that is independent of phase. In a power spectrum, any peak terminates in a tail. Near such a tail resonance lines cannot be well separated. In an attempt to maximize the separation free induction decay signals have been heretofore multiplied by various window functions. However, complete separation has been impossible to realize. Further, the multiplications using window functions pose the additional problem that peaks vanish.

SUMMARY OF THE INVENTION

In view of the foregoing problems, it is the main object of the present invention to provide a two-dimensional nuclear magnetic resonance spectrometry in which the phases of two-dimensional spectra can be easily corrected.

This object is achieved in accordance with the teachings of the present invention by a two-dimensional nuclear magnetic resonance spectrometry comprising the steps of:

(a) applying a radio-frequency pulse train to a sample containing gyromagnetic resonators, the pulse train consisting of a plurality of radio-frequency pulses;

(b) detecting the free induction decay after the end of the application of the radio-frequency pulse train and storing it in a memory;

(c) repeating the steps (a) and (b) with different values of evolution period $t_1$ that is defined as the pulse separation between certain two pulses of the radio-frequency pulse train to generate the data set $S(t_1, t_2)$ of the free induction decay signals, the initial value of $t_1$ being identified as $t_{1000}$;

(d) taking the Fourier transform of the set $S(t_1, t_2)$ of the free induction decay signals with respect to $t_2$ to generate the transformed data set $S_c(t_1, F_2)$ or $S_2(t_1, F_2)$;

(e) obtaining phase angles $\theta_2$ for phase shifting interferograms defined by $t_1$ values corresponding to selected $F_2$ values in the data sets $S_c(t_1, F_2)$ or $S_s(t_1, F_2)$ so that each peak in the interferograms corresponding to peaks in the spectrums $S_c(t_{1000}, F_2)$ and $S_s(t_{1000}, F_2)$ takes an absorption or dispersion waveform;

(f) shifting the phases of all the data in data sets $S_c(T_1, F_2)$ or $S_s(t_1, F_2)$ derived in the step (d) by phase angles $\theta_2$ to make phase correction; and (g) shifting the phases of all the data in data sets $S_c(t_1, F_2)$ or $S_s(t_1, F_2)$ derived in the step (f) by phase angles $\theta_1$ to make phase correction with respect to $t_1$, and simultaneously take the Fourier transform of the data sets $S_c(t_2, F_2)$ or $S_s(t_1, F_2)$ with respect to $t_1$.

This spectrometry is characterized in that the phase of the data obtained by the measurements are corrected immediately after it is subjected to Fourier transformation with respect to $t_2$.

Other objects and features of the invention will appear in the course of the description that follows.

BRIEF DESCRIPTION OF THE DRAWINGS

FIG. 1 is a diagram showing a sequence of measurements used for a J-resolved two-dimensional nuclear magnetic resonance spectrometry;

FIG. 2 is a block diagram of a nuclear magnetic resonance spectrometer for carrying out the present invention;

FIGS. 3(a) and 3(b) are a timing diagram for illustrating the operation of the spectrometer shown in FIG. 2;

FIG. 4 is a representation for illustrating the set $S(t_1, t_2)$ of free induction decay signals;

FIGS. 5(a) and (b) are representations for illustrating $S_c(t_1, F_2)$ and $S_s(t_1, F_2)$, respectively;

FIGS. 6(a)–(b') are diagrams showing iterferograms;

FIGS. 7(a)–(b'') are waveform diagrams for illustrating $S_c(t_{1000}, F_2)$ and $S_s(t_{1000}, F_2)$.

PREFERRED EMBODIMENT OF THE INVENTION

Figure 8A:
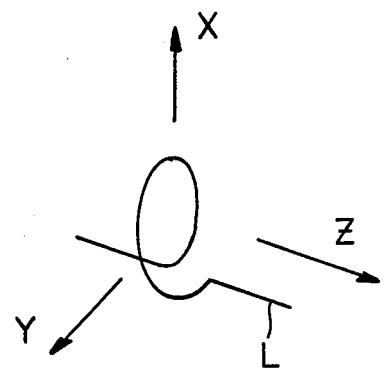
FIGS. 8(a)–8(c) are diagrams for illustrating phase.

Referring to FIG. 2, there is shown a nuclear magnetic resonance spectrometer for carrying out the present invention. This spectrometer includes a magnet 1 that produces a static magnetic field in which a transmitter/receiver coil 2 is placed. A sample to be investigated is inserted in the space inside the coil 2. An RF oscillator 3 generates a radio-frequency signal that contains the resonance frequency of the nuclei under investigation. This RF signal is supplied to the coil 2 as RF pulses via an amplifier 4 and agate 5, and then it is applied to the sample. As a result, a resonance signal is induced in the coil 2 and fed to a demodulator circuit 8 via a gate 6 and a receiver circuit 7. The demodulator circuit 8 also receives the RF signal as a reference signal from the RF oscillator 3. The free induction decay signal obtained from the demodulator circuit 8 is converted into digital form by an analog-to-digital converter 9, and then it is furnished to a computer 10 so that it is stored in a memory 11 incorporated in the computer. Thereafter, the data is arithmetically processed, i.e., it is subjected to Fourier transformation, and the phases are corrected. The gates 5, 6, and the A/D converter 9 are controlled by a pulse programmer 12, which has been already programmed with the sequence of pulse trains applied to the sample, pulse durations, and the timing of the sampling of data performed by the A/D converter 9. A sequence of measurement is made according to the program.

Measurements are made in the sequence shown in FIG. 1 using the instrument shown in FIG. 2 in the manner described below. The gate 5 is enabled during the periods shown in FIG. 3(a), so that a 90° pulse and a 180° pulse are fed to the coil 2 at interval $t_1/2$ and applied to the sample. After period $t_1/2$ elapses since this application of the pulse train, the gate 6 is enabled during the period shown in FIG. 3(b). At the same time, the A/D converter 9 is caused to operate. Thus, the resulting free induction decay signal is detected during period $t_2$ and stored in the memory 11.

This single measurement is repeated with 256 different values of $t_1$. For example, $t_1$ assumes values $t_{1000}$, $t_{1001}$, $t_{1002}$, $t_{1003}$, ..., $t_{1255}$ in turn. Upon completion of the 256 measurements, the free induction decay signals $FID_{000}$–$FID_{255}$ which are obtained corresponding to the 256 different values of $t_1$ are stored in the memory 11. The 256 different free induction decay signals stored in the memory 11 can be considered to be the set $S(t_1, t_2)$ of values $t_{1000}$ (initial value), $t_{1001}$, $t_{1002}$, $t_{1003}$, ..., $t_{1255}$ which are arranged corresponding to the values of $t_1$, as shown in FIG. 4.

We first take the Fourier transform of this set with respect to $t_2$ to convert $t_2$ into frequency domain $F_2$, resulting in cosine component $S_c(t_1, F_2)$ and sine component $S_s(t_1, F_2)$. Both are further converted into frequency domain $F_1$ with respect to $t_1$ by Fourier transformation, resulting in four Fourier components $S_{cc}(F_1, F_2)$, $S_{ss}(F_1, F_2)$, $S_{cs}(F_1, F_2)$ and $S_{sc}(F_1, F_2)$. Then, two-dimensional spectrum $S(F_1, F_2)$ is given by $$S(F_1, F_2) = S_{cc}(F_1, F_2) - S_{ss}(F_1, F_2) + S_{cs}(F_1, F_2) - S_{sc}(F_1, F_2) \quad (1) \text{ ps}$$

In the past, the power spectrum of this two-dimensional spectrum has been given by $$|\{S(F_1, F_2)\}|^2 = [(S_{cc}(F_1, F_2))^2 + (S_{ss}(F_1, F_2))^2 + (S_{cs}(F_1, F_2))^2 + (S_{sc}(F_1, 2))^2]^{\frac{1}{2}} \quad (2)$$

This has presented the aforementioned problems.

The cosine component $S_c(t_1, F_2)$ and the sine component $S_s(t_1, F_2)$ obtained by the Fourier transformation with respect to $t_2$ described above are now discussed. FIGS. 5(a) and (b) show the cosine component $S_c(t_1, F_2)$ and the sine component $S_s(t_1, F_2)$, respectively, which are expressed corresponding to FIG. 4. Because of the relation between the sine and cosine components, the peaks P appearing in FIGS. 5(a) and (b) are 90° out of phase with each other. The Fourier transform of $S_c(t_1, F_2)$ and $S_s(t_1, F_2)$ with respect to $t_1$ means the Fourier transform of the interferograms shown in FIGS. 6(a) and (b) with respect to all the values of $F_2$. These interferograms shown in FIGS. 6(a) and (b) are the sets of points having the same value of $F_2$ which are taken in the direction indicated by the arrow A in FIG. 5(a), for example. Let us take an example in which $F_2$ assumes value $F_{2n}$. One interferogram is given by connecting points $S_c(t_{1000}, F_{2n})$, $S_c(t_{1001}, F_{2n})$, $S_c(t_{1002}, F_{2n})$, and so on which are indicated by dots in FIG. 5(a). The other interferogram is given by connecting points $S_s(t_{1000}, F_{2n})$, $S_s(t_{1001}, F_{2n})$, $S_s(t_{1002}, F_{2n})$, and so on which are indicated by dots in FIG. 5(b).

In taking the Fourier transform of an interferogram, if the phase at the initial value (the origin in time) is zero, and if it assumes a cosine waveform (FIG. 6(a')) or a sine waveform (FIG. 6(b')), then no phase shift will be introduced into the resulting Fourier transform. However, phase shifts can be seen at the points $S_c(t_{1000}, F_{2n})$ and $S_s(t_{1000}, F_{2n})$ of the interferograms shown in FIGS. 6(a) and (b) which are taken at the initial value $t_{1000}$. Accordingly, if the data is subjected to Fourier transformation as it is, a phase shift will appear in the resulting two-dimensional spectrum.

According to the present invention, firstly, the initial data $S_c(t_{1000}, F_2)$ or $S_s(t_{1000}, F_2)$ is obtained from $S_c(t_1, F_2)$ or $S_s(t_1, F_2)$ by inserting an initial value $t_{1000}$. Waveform of the initial data $S_c(t_{1000}, F_2)$ or $S_s(t_{1000}, F_2)$ is observed with shifting the phase of $t_2$ in the initial data. The phase angle $\theta_2$ for phase correction is determined in such a way that waveform of the initial data $S_c(t_{1000}, F_2)$ or $S_s(t_{1000}, F_2)$ takes an absorption or dispersion waveform.

These steps are explained in our specification accompanying with FIGS. 7(a), (b), (a'), (b'), (a''), (b'') and FIG. 8.

The initial data $S_c(t_{1000}, F_2)$ or $S_s(t_{1000}, F_2)$ or $S_s(t_{1000}, F_2)$ phase corrected by $\theta_2$ is used for the following Fourier transformation. Similarly, the phases of the other data in $S_c(t_1, F_2)$ or $S_s(t_1, F_2)$ are shifted also by $\theta_2$ for phase correction.

The corrected data $S_c(t_1, F_2)$ or $S_s(t_1, F_2)$ is subjected to Fourier transformation with respect to $t_1$, and simultaneously subjected to phase correction with respect to $t_1$.

This step is explained in our specification accompanying with FIGS. 6(a), (b), (a'), (b').

Figure 8B:
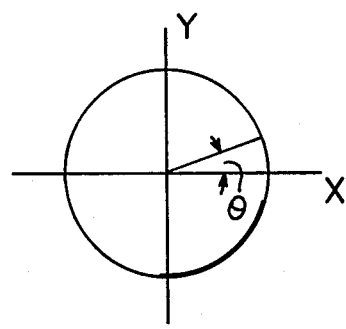
Figure 8C:
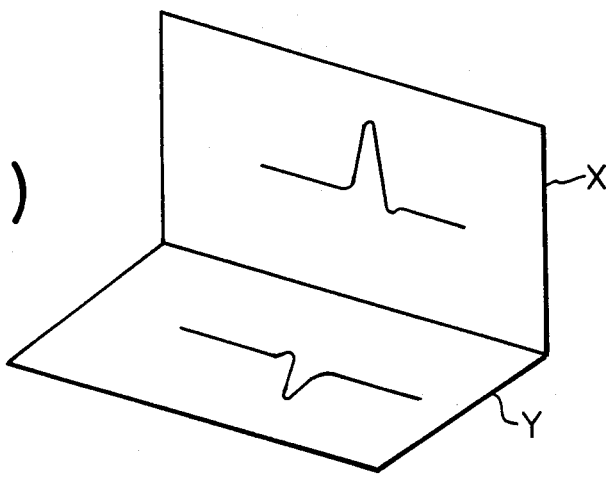

FIGS. 7(a) and (b) show waveform obtained from the data $S_c(t_{1000}, F_2)$ and the data $S_s(t_{1000}, F_2)$, respectively. The data $S_c(t_{1000}, F_2)$ is derived from $S_c(t_1, F_2)$ by setting the initial value equal to $t_{1000}$, while the data $S_s(t_{1000}, F_2)$ is derived from $S_s(t_1, F_2)$ be setting the initial value equal to $t_{1000}$. The peaks P appearing in the waveforms shown in FIGS. 7(a) and (b) may be considered to be the projection of a coil L consisting of a single turn as shown in FIG. 8(a) onto orthogonal X and Y planes, for facilitating the understanding. Specifically, if the orbit of gyromagnetic resonators near resonance point $F_{2n}$ is given by the coil L in a three-dimensional manner, then the projection of this orbit onto the X plane is the waveform shown in FIG. 7(a). The projection of the orbit onto the Y plane is the waveform shown in FIG. 7(b). It is to be noted that the coil L is not shown in FIG. 8(b) but in reality the straight portion of the coil L conincides with the axis Z. The relation of the coil L to the X and Y planes corresponds to phase. If the X and Y planes are rotated about the axis Z in FIG. 8(c), the relation of the coil L to the X and Y planes, or phase, changes. Thus the waveforms shown in FIGS. 7(a) and (b) change to the waveforms shown in FIGS. 7(a') and (b'), respectively. Just when they rotate through a certain angle $\theta$, the waveforms become the absorption waveform shown in FIG. 7($a''$) and the dispersion waveform shown in FIG. 7($b''$). This is the condition in which the initial phase is zero.

In order to shape the peaks P into such a waveform, the data $S_c(t_{1000}, F_2)$ and the data $S_s(t_{1000}, F_2)$ are given by cos $\omega$ and sin $\omega$, respectively. Then, the waveforms are rotated through $\theta$ to derive cos $(\omega+\theta)$ and sin $(\omega+\theta)$. Obviously, these are arithmetically obtained from the equality cos $(\omega+\theta)$=cos $\omega$ cos $\theta$− sin $\omega$ sin $\theta$ and the equality sin $(\omega+\theta)$=sin $\omega$ cos $\theta$+cos $\omega$ sin $\theta$.

In actuality, an arithmetic operation is repeated with different values of $\theta$ to find the value of $\theta_2$ at which the peak intensity of an absorption waveform takes on a maximum value. In this way, the absorption and dispersion waveforms shown in FIGS. 7($a''$) and ($b''$), respectively, are provided. Let $S_c(t_{1000}, F_2)$ and $S_s(t_{1000}, F_2)$ be the corrected data.

In this manner, the phase angle $\theta_2$ by which the phase is shifted for phase correction is found. And then, all the other data items contained in $S_c(t_1, F_2)$ and $S_s(t_1, F_2)$ are arithmetrically treated for phase correction to obtain Fourier components $S_c(t_1, F_2)$ and $S_s(t_1, F_2)$ the phases of which have been corrected with respect to $t_2$.

Further, the above Fourier components $S_c(t_1, F_2)$ and $S_s(t_1, F_2)$ are arithmetrically treated for phase correction with phase angle $\theta_1$ to obtain Fourier components $S_c(t_1, F_2)$ and $S_s(t_1, F_2)$ the phases of which have been corrected with respect to $t_1$. Phase angle $\theta_1$ in the phase correction is determined so that the interferograms as similarly shown by FIG. 6($a$) or FIG. 6($b$) change the cosine waveform (FIG. 6($a$)) or sine waveform (FIG. 6($b$)) by phase correction with respect to $t_1$. In this case, the interferogram as similarly shown by FIG. 6($a$) or FIG. 6($b$) are obtained for the Fourier component $S_c(t_1, F_2)$ and $S_s(t_1, F_2)$ the phases of which have been corrected with respect to $t_2$. Then the Fourier components $S_c(t_1, F_2)$ and $S_s(t_1, F_2)$ are subjected to Fourier transform with respect to $t_1$, so that the two-dimensional spectrum is derived. This two-dimensional spectrum is free of phase shift and hence it is a correct spectrum.

Actually, the above phase correction and Fourier transform is simultaneously carried out by using the technique, for example, so-called "Fourier self-deconvolution method" as mentioned in *Anal. Chem.* 1981, 53, 1454–1457 or in *APPLIED OPTICS*, Vol. 20, No. 10, May 15, 1981.

Additionally, it suffices to take the Fourier transform of only one of $S_c(t_1, F_2)$ and $S_s(t_1, F_2)$. Therefore, the data which should be obtained after the phase correction is either $S_c(t_1, F_2)$ or $S_s(t_1, F_2)$.

Although the phases of all the data items have been corrected in the description thus far made, this is not essential to the present invention. For example, it is possible to correct only the data about the range of $F_2$ in which a peak exists, by arithmetic operation. Where a plurality of peaks exist, correction may be made to the data about the ranges of data in which the peaks exist. In this case, the phase angle through which phase is shifted for phase correction may differ from peak to peak. Accordingly, it is desired to make the phase angle different among the peaks.

I claim:

1. A method of two-dimensional nuclear magnetic resonance spectrometry comprising the steps of:
   (a) applying a radio-frequency pulse train to a sample containing gyromagnetic resonators, the pulse train consisting of a plurality of radio-frequency pulses;
   (b) detecting the free induction decay after the end of the application of the radio-frequency pulse train and storing it in a memory;
   (c) repeating the steps (a) and (b) with different values of evolution period $t_1$ that is defined as the pulse separation between certain two pulses of the radio-frequency pulse train to generate the data set $S(t_1, t_2)$ of the free induction decay signals, the initial value of $t_1$ being identified as $t_{1000}$;
   (d) taking the Fourier transform of the set $S(t_1, t_2)$ of the free induction decay signals with respect to $t_2$ to generate the transformed data set $S_c(t_1, F_2)$ or $S_s(t_1, F_2)$;
   (e) obtaining phase angle $\theta_2$ for phase shifting interferograms defined by $t_1$ values corresponding to selected $F_2$ values in the data sets $S_c(t_1, F_2)$ or $S_s(t_1, F_2)$ so that each peak in the interferograms corresponding to peaks in the spectrums $S_c(t_{1000}, F_2)$ and $S_s(t_{1000}, F_2)$ takes an absorption or dispersion waveform;
   (f) shifting the phases of all the data in data sets $S_c(t_1, F_2)$ or $S_2(t_1, F_2)$ derived in the step (d) by phase angles $\theta_2$ to make phase correction; and
   (g) shifting the phases of all the data in data sets $S_c(t_1, F_2)$ or $S_s(t_1, F_2)$ derived in the step (f) by phase angles $\theta_1$ to make phase correction with respect to $t_1$, and then taking the Fourier transform of the data sets $S_c(t_1, F_2)$ or $S_s(t_1, F_2)$ with respect to $t_1$.

* * * * *